(12) United States Patent
Beyer et al.

(10) Patent No.: US 11,555,783 B2
(45) Date of Patent: Jan. 17, 2023

(54) METHOD FOR DETECTING PARTICLES ON THE SURFACE OF AN OBJECT, WAFER, AND MASK BLANK

(71) Applicant: Carl Zeiss SMT GmbH, Oberkochen (DE)

(72) Inventors: Oliver Beyer, Heidenheim (DE); Michael Gerhard, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 533 days.

(21) Appl. No.: 16/585,374

(22) Filed: Sep. 27, 2019

(65) Prior Publication Data

US 2020/0026198 A1 Jan. 23, 2020

Related U.S. Application Data

(63) Continuation of application No. PCT/EP2018/056352, filed on Mar. 14, 2018.

(30) Foreign Application Priority Data

Mar. 28, 2017 (DE) ...................... 10 2017 205 212.0

(51) Int. Cl.
*G01N 21/47* (2006.01)
*G01N 21/95* (2006.01)
(Continued)

(52) U.S. Cl.
CPC ......... *G01N 21/47* (2013.01); *G01N 21/9501* (2013.01); *G03F 1/50* (2013.01);
(Continued)

(58) Field of Classification Search
CPC ............... G01N 21/47; G01N 21/9501; G01N 2021/4711; G03F 1/50; G03F 7/7065; G03F 1/72; G03F 1/84; G03F 7/7085
See application file for complete search history.

(56) References Cited

U.S. PATENT DOCUMENTS 4,767,660 A * 8/1988 Hosoda ................. G03F 7/0005
428/209
5,242,711 A * 9/1993 DeNatale ............ C23C 16/0272
156/308.2
(Continued)

FOREIGN PATENT DOCUMENTS

CN 102117850 A 7/2011
DE 102014204171 A1 9/2015
(Continued)

OTHER PUBLICATIONS

Nguyen et al "Black silicon with sub-percent reflectivity: Influence of the 3D texturization geometry",Transducers'11, Beijing, China, Jun. 5-9, 2011.*

(Continued)

*Primary Examiner* — Dominic J Bologna
*Assistant Examiner* — Jarreas C Underwood
(74) *Attorney, Agent, or Firm* — Edell, Shapiro & Finnan, LLC (57) ABSTRACT

A method for detecting deposited particles (P) on a surface (11) of an object (3, 14) includes: irradiating a partial region of the surface (11) of the object (3, 14) with measurement radiation; detecting measurement radiation scattered on the irradiated partial region, and detecting particles in the partial region of the surface of the object (3, 14) based on the detected measurement radiation. In the steps of irradiating and detecting, the surface (11) of the object (3, 14) has an anti-reflective coating (13) and/or a surface structure (15) for reducing the reflectivity of the surface (11) for the measurement radiation (9), wherein the particle detection limit is lowered due to the anti-reflective coating (13) and/or the surface structure (15). Also disclosed are a wafer (3) and a mask blank for carrying out the method.

17 Claims, 2 Drawing Sheets

(51) Int. Cl.
*G03F 1/84* (2012.01)
*G03F 7/20* (2006.01)
*G03F 1/50* (2012.01)
*G03F 1/72* (2012.01)

(52) U.S. Cl.
CPC .... *G03F 7/7065* (2013.01); *G01N 2021/4711* (2013.01); *G03F 1/72* (2013.01); *G03F 1/84* (2013.01); *G03F 7/7085* (2013.01)

(56) References Cited

U.S. PATENT DOCUMENTS

| | | | | |
|---|---|---|---|---|
| 5,585,916 | A * | 12/1996 | Miura | G01N 21/21 |
| | | | | 250/559.4 |
| 6,137,570 | A * | 10/2000 | Chuang | G01N 21/9501 |
| | | | | 250/559.04 |
| 6,608,321 | B1 * | 8/2003 | La Fontaine | G01N 21/95607 |
| | | | | 250/559.43 |
| 6,781,688 | B2 * | 8/2004 | Kren | G01N 21/9501 |
| | | | | 356/394 |
| 2002/0088952 | A1 * | 7/2002 | Rao | G01N 21/9501 |
| | | | | 250/559.45 |
| 2004/0169850 | A1 * | 9/2004 | Meeks | G01B 11/0641 |
| | | | | 257/E21.53 |
| 2006/0008749 | A1 * | 1/2006 | Sobel | C23C 14/0676 |
| | | | | 430/394 |
| 2007/0128528 | A1 * | 6/2007 | Hess | G03F 1/30 |
| | | | | 430/5 |
| 2009/0279101 | A1 * | 11/2009 | Kalkowski | H02N 13/00 |
| | | | | 356/512 |
| 2012/0321246 | A1 | 12/2012 | Pomerene et al. | |
| 2015/0268165 | A1 | 9/2015 | Saito et al. | |
| 2016/0153914 | A1 * | 6/2016 | Lange | G01N 21/8806 |
| | | | | 356/237.5 |
| 2016/0377988 | A1 | 12/2016 | Paul et al. | |
| 2017/0045823 | A1 | 2/2017 | Quintanilha | |
| 2017/0075211 | A1 | 3/2017 | Hayashi | |

FOREIGN PATENT DOCUMENTS

| | | |
|---|---|---|
| JP | S5072911 A | 6/1975 |
| JP | S62282445 A | 12/1987 |
| JP | H01185434 A | 7/1989 |
| JP | H0259651 A | 2/1990 |
| JP | H09113927 A | 5/1997 |
| JP | 2003177100 A | 6/2003 |
| JP | 2006270111 A | 10/2006 |
| JP | 2010210568 A | 9/2010 |
| JP | 2010267934 A | 11/2010 |
| JP | 2013242179 A | 12/2013 |
| JP | 2017050256 A | 3/2017 |
| WO | 0000817 A1 | 1/2000 |

OTHER PUBLICATIONS

German Office Action English translation, German Application No. 102017205212.0, 2 pages, dated Jan. 31, 2018.
International Preliminary Report on Patentability and the Written Opinion, English translation, PCT/EP2018/056352, 8 pages, dated Oct. 1, 2019.
International Search Report and Written Opinion, PCT/EP2018/056352, dated Jul. 3, 2018, 12 pages.
International Search Report in English and German, dated Jul. 3, 2018, 6 pages.
Gaebler, English translation of Sect ions 3.4-3.42 of unpublished thesis of Gaebler, Daniel (Oct. 2005) entitled "Entspiegelung von Silizium-Photodoiden nach dem Vorbild der Nanooptik von Mottenaugen" [Rendering silicon photodiodes anti-reflective vased on the model of the nanooptics of moth eyes], Technische Universitaet Illmenau. https://www.researchgate.net/publications/261376779, uploaded Apr. 2014, 9 pages.
JP Office Action with English translation, Application No. 2019-553253, dated Jan. 18, 2022, 10 pages.
EP Office Action with English translation, Application No. 18 712 138.9, dated Sep. 20, 2022, 4 pages.

\* cited by examiner

METHOD FOR DETECTING PARTICLES ON THE SURFACE OF AN OBJECT, WAFER, AND MASK BLANK

CROSS REFERENCE TO RELATED APPLICATIONS

This is a Continuation of International Application PCT/EP2018/056352, which has an international filing date of Mar. 14, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 205 212.0 filed on Mar. 28, 2017.

FIELD OF THE INVENTION

The invention relates to a method for detecting deposited particles on the surface of an object, comprising: irradiating a partial region of the surface of the object with measurement radiation, detecting measurement radiation scattered at the irradiated partial region, and detecting the particles on the surface of the object based on the detected measurement radiation.

BACKGROUND

The deposited particles are typically undesirable disturbing particles. It is possible for example to check the cleanliness in a clean room based on the number of the detected disturbing particles. The (test) object can in principle be any object that has a surface suitable for detecting disturbing particles.

The above-described method can be performed for example for detecting deposited particles on the surface of a plate-type object in the form of a (typically non-exposed) wafer or of a mask blank for microlithography, for example for EUV lithography. The measurement principle of particle detection is based on the scattering of the measurement radiation at the surface of the object. Measurement apparatuses that are based on the principle of particle detection by detecting measurement radiation that is scattered back at a surface are offered for example by Rudolph Technologies Inc. under the trade name "Reflex FSI" for examining wafers or under the trade name "Reflex TT MBI" for examining masks.

In these measurement apparatuses, measurement radiation in the form of a laser beam is typically used to irradiate the surface of the object at a specified angle of incidence. The measurement radiation scattered at the surface is detected in a dark-field measurement, that is to say the detection angle range within which the measurement radiation that is scattered at the surface of the object is detected deviates from the angle of incidence of the measurement radiation that is used to irradiate the surface, with the result that the radiation portion that is reflected at the surface is ignored.

In such a dark-field measurement, the entire radiation portion that is reflected at a perfect, completely smooth surface is suppressed on said surface, which means that only the measurement radiation scattered at the surface is detected. However, each surface has a roughness at the microscopic level, which means that a portion of measurement radiation that is reflected at the surface is inevitably also detected during the detection of the measurement radiation. Said portion of the detected measurement radiation produces a background signal, the strength of which depends on the roughness or on the polishing quality of the surface and possibly on the homogeneity of (thin) films applied on the surface, with the surface to be examined being formed on the upper side thereof.

In addition to the background signal, which is also referred to as haze signal, a defect signal is also recorded during the detection of the measurement radiation. In the above-described measurement principle, the surface of the object is typically divided into a measurement grid and a respective matrix element or a partial region of the surface is scanned by the measurement radiation. The measurement radiation that is detected during the scanning of the partial region or of the matrix element is added up or integrated. The detected measurement radiation or the detected measurement signal per partial region or per matrix element is additively composed of the background signal or haze signal and of the defect signal. The defect signal is caused by particles deposited on the surface or possibly depressions and by local defects such as scratches or local surface defects. Scratches or local surface defects can generally be distinguished from particles by way of local patterns in the detected measurement radiation of adjacent partial regions being identified. For example, if the detected measurement radiation in a plurality of adjacent partial regions lies above a threshold value, a local surface defect can be identified. While surface defects typically have a two-dimensional extent, scratches typically have a directional spatial distribution with a substantially one-dimensional extent and therefore can generally likewise be identified and distinguished from particles. Independently of the distinction between particles and scratches or local surface defects in the defect signal, it is necessary for the detection of particles to distinguish between the values of the scattered light intensity that are assigned to the haze signal and the values of the scattered light intensity that are assigned to the defect signal. The haze signal or the roughness of the surface consequently limits the particle detection limit, that is to say the minimum diameter, at which the particles can still be uniquely detected. A typical order of magnitude for the detection limit of particles or for the minimum particle diameter in the present application is approximately 100 nm or less.

SUMMARY

It is an object of the invention to provide a method for detecting particles on the surface of an object, as well as a wafer and a mask blank for performing the method, in which the detection limit of the detected particles can be lowered below the typical detection limit noted herein-above.

Said object is achieved by a method of the type mentioned in the introductory part, in which, during the steps of irradiating and detecting the measurement radiation, the surface of the object is provided with an anti-reflective coating and/or with a surface structure for reducing the reflectivity for the measurement radiation.

According to one formulation of the invention, the particles are detected on an object, the surface of which was treated, before detection of the particles, to reduce the reflectivity for the measurement radiation. For this purpose, an anti-reflective coating can be applied onto the surface of the object and/or a surface structure can be provided on the surface, typically being provided on the surface in a step that precedes the particle detection. In addition to anti-reflective coatings, surface structures can also significantly reduce the reflectivity of the surface for the measurement radiation because there is no sharp interface at which the measurement radiation can be reflected in accordance with the Fresnel equations. Both an anti-reflective coating (that is as homogeneous as possible) and the surface structure in the present application or by themselves typically bring about only a negligibly small scattered light portion or only slightly change the roughness of the surface in the spatial frequency range that is relevant for the scattered light measurement.

Reducing the reflectivity of the surface by way of the anti-reflective coating and/or by way of the surface structure is useful for the detection of the particles because in this way the scattering and thus the intensity of the background signal or haze signal are also decreased, which means that less measurement radiation is scattered at the rough surface of the object. The defect signal is produced by particles deposited on the surface of the anti-reflective coating and/or the surface structure, with the result that the scattering at the particles is influenced not at all or only very slightly by the anti-reflective coating and/or the surface structure lying underneath, in particular if the particles are not too strongly absorbing particles. By reducing the reflectivity, the width of the haze distribution or of the haze signal is also reduced. The intensity threshold value above which the measured signal or the measurement radiation is interpreted to be a defect signal is typically around $3\sigma$, wherein $\sigma$ designates the standard deviation of the haze distribution. Therefore, the width of $3\sigma$ (measured from the maximum of the haze distribution) specifies the lower particle detection limit.

Assuming that the anti-reflective coating and/or the surface structure reduces the reflectivity of the surface for the measurement radiation by half, the entire haze distribution is reduced by half, that is to say both the intensity value of the maximum of the haze distribution and the standard deviation of the haze distribution are halved. The distance between a maximum of the haze distribution and the maximum of the particle distribution, by contrast, remains constant. The constancy of the distance is based on the assumption that the entire scattered light intensity emanating from a surface element or from a partial region of the surface of the object is additively composed of the scattered light portion of the surface (haze) and the defect scattered light portion. The signal-to-noise ratio during the detection of the particles therefore increases on account of the reduction in reflectivity, and the detection limit of the particles is lowered. It is to be understood that the anti-reflective coating or the surface structure typically extend over the entire surface on which particles are to be detected.

The irradiated partial region of the surface is a typically approximately point-shaped partial region on which the measurement radiation is typically radiated at a specified angle of incidence, generally perpendicularly to the surface normal. The surface on which the particles are detected is frequently a planar surface, which means that the surface normal at all locations or partial regions of the surface has the same direction. In order to be able to detect particles on the entire surface, the partial region or the matrix element over which the detected measurement radiation is integrated is typically guided over the surface in a scanning movement, for which purpose both the object to be examined and the measurement radiation or the measurement light source can be moved relative to one another.

In one variant, the particles are detected on the surface of an object in the form of a mask blank for microlithography or a wafer for microlithography. The detection of particles is typically performed on the surface of a non-exposed wafer that is possibly provided with a radiation-sensitive layer (resist) or on a non-structured mask, for example a non-structured EUV mask. In such a measurement, it is possible to simultaneously measure the surface roughness of the wafer or of the mask. If the point is to detect particles on the surface of a wafer or of a mask, it is useful for reducing the particle detection limit if they are provided with a reflection-reducing anti-reflective coating and/or with a suitable surface structure. The adhesion of particles on a surface thus treated differs possibly not at all or only slightly from the adhesion to the surface of a conventional wafer or of a conventional mask blank or can be converted using a suitable calibration into the particle number occurring on a conventional wafer or on a conventional mask blank, with the result that the detection of particles on a correspondingly modified wafer or on a correspondingly modified mask blank is as meaningful as the detection of particles on a non-modified wafer or on a non-modified mask blank.

In another variant, the measurement radiation has a predetermined measurement wavelength. The measurement radiation is typically monochromatic, that is to say it has a single, defined wavelength. Monochromatic measurement radiation can be produced for example by a laser or for example by a laser diode. The measurement wavelength of the measurement radiation is typically in the visible wavelength range between approximately 380 nm and approximately 750 nm, for example at approximately 405 nm or at 635 nm. The use of monochromatic measurement radiation has proven useful for scattered light measurement.

In a further variant, the scattered measurement radiation is detected in a detection angle range between a first scattering angle and a second scattering angle with respect to the incident measurement radiation. The detection of the measurement radiation scattered at the partial region of the surface only in a specified detection angle range is useful because the surface scattering is anisotropic (Bragg diffraction), which means that the detection angle or detection angles is/are correlated with the spatial frequency of the haze signal and it is possible with a suitable selection of the detection angle range to select a suitable spatial frequency range for the detection in which the haze signal or the surface roughness is as small as possible. Since the scattering at particles in a specific diameter range can substantially be assumed to be isotropic, it is possible to select the detection angle range such that the ratio between the scattered light intensity of the particles to the scattered light intensity of the surface scattering is as great as possible. In order to select a suitable detection angle range, the roughness of the surface of the object under examination should be known as accurately as possible, and the variation of the surface roughness should not be too great.

The anti-reflective coating is in the form of a multilayer coating in a further variant. A multilayer coating typically has a plurality of layers with high and low refractive indices in alternation, wherein the layer thicknesses and the layer materials or the refractive indices of the individual layers are selected such that the desired reduction in reflectivity of the surface of the object is obtained. Such a multilayer coating is typically designed such that it produces destructive interference for measurement radiation at the measurement wavelength and in this way reduces the reflectivity. The multilayer coating can under certain circumstances significantly reduce the reflectivity of the surface or of the object over a comparatively large spectral range. It is to be understood that when designing the multilayer coating, the material of the object, in particular the refractive index of the object, is typically also taken into consideration. It may also be possible to use an anti-reflective coating having only a single layer instead of a multilayer coating. An anti-reflective coating can in particular also be realized by a gradual transition between the refractive index of the environment and the refractive index of the material of the object. When using such an anti-reflective coating having a plurality of layers, the refractive index from the environment to the material of the object gradually increases.

In a further variant, the anti-reflective coating has, in the detection angle range between the first scattering angle and the second scattering angle, an angle-dependent reflectivity for the measurement radiation at which a difference between a maximum value of the reflectivity and a minimum value of the reflectivity is less than 5%, preferably less than 2%, more preferably less than 1%. The reflectivity of the anti-reflective coating should ideally be constant in the detection angle range, but at least vary only within the range specified further above.

In a further variant, the reflectivity of the anti-reflective coating for the measurement radiation in the detection angle range between the first scattering angle and the second scattering angle is less than 15%, preferably less than 5%, in particular less than 1%. As was described further above, the anti-reflective coating is optimized for a specific material of the object. The reduction in reflectivity or the reflectivity of the anti-reflective coating is therefore dependent on the material of the object on which the surface is formed and can differ for different materials. The anti-reflective coating ideally makes a reduction of the reflectivity of the surface in the detection angle range to less than 1% possible.

In a further variant, the surface structure is embodied as a needle-type microstructure in particular in the manner of a moth-eye structure. Such a microstructure can have for example needles or needle-type structures with a lateral extent in the order of magnitude of less than approximately 1 μm and a length in the order of magnitude of for example approximately 10 μm. With such a microstructure it is possible to produce a substantially continuous transition of the refractive index from the environment to the surface of the object, as a result of which the absorption of the measurement radiation is increased and the reflectivity of the surface is thus reduced.

In a further embodiment, the object is formed from silicon. The expression that the object is formed from silicon does not necessarily mean that the object consists entirely of silicon; rather, the object can have a substrate made from silicon on which a coating may be applied, for example at least one layer made from an epitaxially grown silicon or another material. The upper side of such a coating can form the surface on which the anti-reflective coating is applied and/or on which the surface structure is provided. The object that is formed from silicon can be for example a wafer for microlithography.

The uncoated surface of an object made from silicon typically has a high reflectivity for measurement radiation at measurement wavelengths in the visible wavelength range, which may be for example more than approximately 40%. By using a suitable anti-reflective coating it is possible to significantly reduce the reflectivity of silicon for measurement wavelengths in the visible wavelength range. Anti-reflective coatings for silicon are known for example from the thesis "Entspiegelung von Silizium-Photodioden nach dem Vorbild der Nanooptik von Mottenaugen" [Rendering silicon photodiodes anti-reflective based on the model of the nanooptics of moth eyes], D. Gabler, T U Ilmenau, 2005, with the entire thesis being incorporated by reference in the content of this application. In addition to anti-reflective coatings without a surface structure, structured, for example hexagonal, surface structures in the manner of moth eyes, which can possibly be combined with an anti-reflective coating to significantly reduce the reflectivity of silicon, are also described in said document. An anti-reflective coating that can be used in this case is for example a—possibly structured—layer made of $Si_xN_y$, for example of $Si_3N_4$.

In a refinement, the surface structure is in the form of black silicon. Black silicon represents a surface modification of crystalline silicon and can be produced for example on the surface of silicon by high-energy bombardment with ions or with ultra-short laser pulses, wherein the needle-type microstructure described further above that increases the absorption of the measurement radiation and reduces reflectivity is formed.

As was described further above, it is possible in principle to reduce the reflectivity of the surface when there is a gradual or possibly continuous transition of the refractive index from the environment of the object, typically air, to the material of the object. This can be achieved by way of an anti-reflective coating and/or by a surface structure, for example by a grating structure or a moth-eye structure, producing such a refractive index profile (as an effective medium).

In a further variant, the object is formed from an optical filter glass for filtering the measurement radiation at the measurement wavelength, in particular from a long-pass filter glass. In addition to the reflectivity of the surface on the front side of the object at which the object is irradiated with measurement radiation, the reflectivity at the rear side of the object also plays a role in the scattered light measurement, that is to say that side that faces away from the measurement radiation, when the object exhibits high transmittance for the measurement radiation. The reflection of measurement radiation at the rear side of the object should also be minimized. One possibility for minimizing the reflection at the rear side of the object is to use for the measurement an object made from a material that has high absorptance or a high absorption coefficient for the measurement radiation. The material of the object can be, for example, an optical filter glass, the transmittance of which is very low at the measurement wavelength, with the result that it has an internal transmittance for example in the entire visible wavelength range of less than $10^{-5}$ at a thickness of 3.0 mm, as is the case for example with the ion-colored long-pass filter glass RG1000 by Schott. The optical filter glass can be used for example instead of a conventional, transparent glass substrate, as is used, where appropriate, in mask blanks for microlithography.

In a further variant, the object is made from a material that has, for the measurement radiation, an absorption coefficient of more than $1\times10^4$ 1/cm. This material can be the optical filter glass that was mentioned further above. Other materials, for example silicon, also have an absorption coefficient for the measurement radiation that, at a measurement wavelength of approximately 405 nm, is typically for example more than approximately $10^5$ 1/cm.

In the case of a further variant, the object has a thickness of at least 500 μm, preferably of at least 1 mm. The absorptance of the material increases as the thickness of the material increases. Conventional silicon wafers have a thickness of approximately 650 μm and, due to the high absorption coefficient (see above), absorb nearly the entire measurement radiation, which means that practically no measurement radiation is reflected by the rear side of a conventional wafer.

In a further variant, a particle is detected in the irradiated partial region only in the case that a scattered light intensity of the measurement radiation scattered at the partial region lies above an intensity threshold value. For scattering centers having a diameter $D_S$ of less than approximately half the measurement wavelength, for example approximately 200 nm or less, it is approximately true that the scattered light intensity I is proportional to the sixth power of the diameter, i.e. $I \sim D_S^6$ (Rayleigh scattering). Relatively large scattering centers as are caused by particles therefore result in a high scattered light intensity I, while the roughness or unevennesses of the surface cause a lower scattered light intensity I. If a scattered light intensity I is measured in a partial region of the surface that lies above the intensity threshold value, it can be assumed that a particle is present on the surface in the partial region; at least the exceeding of the threshold value is a necessary condition for the presence of a particle in the partial region.

In a further variant, at least the steps of irradiating the object with measurement radiation and detecting the scattered measurement radiation are performed on a measurement apparatus for measuring mask blanks or wafers for microlithography. The object under examination can in this case be a (modified) wafer or a (modified) mask blank, although it is also possible to examine in the measurement apparatus other plate-type objects having dimensions that are suitable for such a measurement apparatus. The step of detecting particles can likewise be performed on the measurement apparatus, but it is also possible to perform the evaluation of the detected measurement radiation in a different, spatially separate apparatus.

The invention also relates to a wafer in which an anti-reflective coating and/or a surface structure for reducing the reflectivity of a surface for measurement radiation at at least one measurement wavelength in the visible wavelength range or in the UV wavelength range is/are provided on the surface. Such a wafer (measurement wafer) can advantageously be used when performing the method described further above. The anti-reflective coating or the surface structure can be formed in the manner described further above in conjunction with the method. The wafer typically consists of silicon. As was described further above, the visible wavelength range lies between 380 nm and 750 nm. The UV wavelength range within the meaning of this application lies at wavelengths between 190 nm and 380 nm. The use of measurement radiation at smaller wavelengths than in the visible wavelength range may be useful because the scattered light intensity at particles (Rayleigh scattering) is typically proportional to $1/\lambda_M^4$, where $\lambda_M$ designates the measurement wavelength.

The invention also relates to a mask blank for microlithography, in particular for EUV lithography, in which an anti-reflective coating and/or a surface structure for reducing the reflectivity of a surface for measurement radiation at at least one measurement wavelength in the visible wavelength range or in the UV wavelength range is provided on the surface. Such a mask blank, that is to say a non-structured mask, can also be advantageously used in the method described further above for reducing the particle detection limit.

A mask blank when used for EUV lithography is typically made from what is known as zero-expansion material, that is to say from a material having a low coefficient of thermal expansion, such as for example the glass ceramic Zerodur® (trademark of Schott) or the titanium-doped quartz glass ULE® (trademark of Corning) or other glass ceramics or titanium-doped quartz glasses having a small coefficient of thermal expansion. The material used for mask blanks for VUV lithography can be, for example, conventional quartz glass provided for example with a chromium layer, for example from NTAR7.

The anti-reflective coating in the wafer described above and/or in the mask blank described above can in particular be embodied as described further above in conjunction with the method and have, in a detection angle range between the first scattering angle and the second scattering angle, an angle-dependent reflectivity for the measurement radiation at which a difference between a maximum value of the reflectivity and a minimum value of the reflectivity is less than 5%, preferably less than 2%, in particular less than 1%, and/or in which the reflectivity of the anti-reflective coating for the measurement radiation in the detection angle range is less than 15%, preferably less than 5%, in particular less than 1%. The first (minimum) angle of the detection angle range can in particular be 20° or less, the second angle of the detection angle range can in particular be 60° or more.

Further features and advantages of the invention are evident from the following description of exemplary embodiments of the invention, with reference to the Figures of the drawing, which show details essential to the invention, and from the claims. The individual features may be realized in each case individually by themselves or as a plurality in any desired combination in a variant of the invention.

BRIEF DESCRIPTION OF THE DRAWINGS

Exemplary embodiments are illustrated in the schematic drawing and will be explained in the following description. In the Figures.

DETAILED DESCRIPTION

In the following description of the drawings, identical reference signs are used for identical or functionally identical components.

Figure 1A:
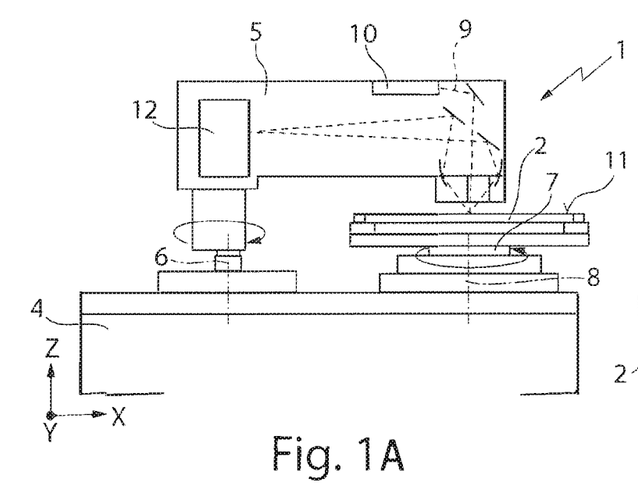
FIG. 1A shows a schematic illustration of a measurement apparatus for inspecting the surfaces of mask blanks or wafers for microlithography, in particular for detecting particles.

FIG. 1A shows a measurement apparatus 1 for examining a mask 2 or a wafer 3 using a scattered light measurement. The measurement apparatus 1 can be for example a measurement apparatus 1 offered by Rudolph, Inc. under the trade name "Reflex TT MBI" for examining masks 2 or a measurement apparatus 1 offered under the trade name "Reflex TT FSI" for examining wafers 3.

The measurement apparatus 1 has a fixed machine body 4, on the upper side of which a measurement head 5 is mounted. The measurement head 5 is mounted on the machine body 4 rotatably about an axis of rotation 6 extending in the Z-direction of an XYZ coordinate system. A rotary plate 7 that is mounted rotatably about a further axis of rotation 8 extending in the Z-direction is also mounted on the machine body 4.

Figure 1B:
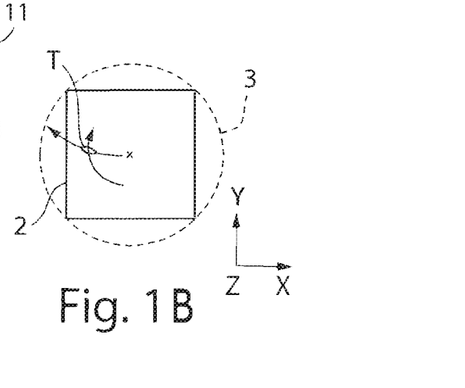
FIG. 1B shows a plan view of a mask or of a wafer with a partial region that is irradiated with measurement radiation by the measurement apparatus.

The measurement head 5 has a measurement light source 10 in the form of a laser diode for producing measurement radiation 9 in the form of a measurement light beam at a measurement wavelength $\lambda_M$ of approximately 405 nm. The measurement radiation 9 emitted by the measurement light source 10 is deflected in the Z-direction, that is to say parallel to the two axes of rotation 6, 8, at a deflection mirror and is incident on the upper side of a mask 2 situated on the rotary plate 7 in a substantially round partial region T, which is shown in FIG. 1B. The partial region T can be moved over the surface 11 of the mask 2 by rotating the mask 2 about the further axis of rotation 8 and by rotating the measurement head 5 about its axis of rotation 6, with the result that the partial region T can be moved or displaced along the entire surface 11 of the mask 2. The measurement apparatus 1 or a suitably modified measurement apparatus 1 can also be used for examining a wafer 3, shown in FIG. 1B.

Figure 2A:
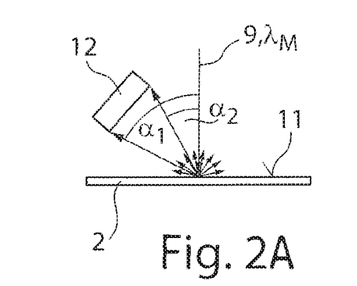
FIG. 2A shows a schematic illustration of measurement radiation that is used to irradiate the surface and is scattered at the surface into a detection angle range.

As can be seen in FIG. 2A, the measurement radiation 9 that is used to irradiate the planar surface 11 of the mask 2 perpendicularly and thus in the direction of the surface normal is scattered back at the surface 11 in all directions of a hemisphere. However, a detector 12 mounted in the measurement head 5 detects only that measurement radiation 9 that is scattered at the substantially point-shaped partial region T in a detection angle range that lies between a first scattering angle $\alpha_1$ and a second scattering angle $\alpha_2$. In the example shown, the first scattering angle $\alpha_1$ is 32° and the second scattering angle $\alpha_2$ is 68°. In order to detect scattered measurement radiation 9 only in the detection angle range between the first and second scattering angles $\alpha_1$, $\alpha_2$ with the detector 12, an elliptical concave mirror and a pinhole mirror are integrated in the measurement head 5. Unlike in the case that is indicated in FIG. 2A, the detection angle range is rotationally symmetric with respect to the partial region T, that is to say the entire measurement radiation 9 that is scattered back at the partial region T in the detection angle range in the circumferential direction (that is to say over an angle of 360°) is captured by the detector 12.

Figure 2B:
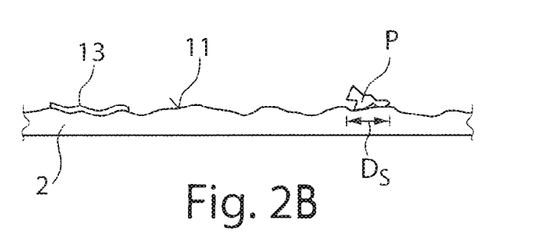
FIG. 2B shows a schematic illustration of the surface to be inspected with a particle deposited on the surface.

Since the measurement radiation 9 is radiated perpendicularly onto the surface 11, the measurement radiation 9 that is reflected at an ideal, entirely planar surface 11 would have to leave the surface 11 likewise in the perpendicular direction and therefore lie outside the detection angle range captured by the detector 12. In practice, every surface 11 has a roughness on a microscopic scale that depends on the quality of the polishing methods used, on the material from which the surface 11 is made, etc. FIG. 2B shows a detail of a real surface 11 having such microscopic roughness. Likewise shown is a particle P deposited on the surface 11 and a coating 13 that is applied in a section of the surface 11. The measurement radiation 9 that is scattered at the surface 11 and captured by the detector 12 has a first portion, brought about by scattered light due to the roughness of the surface 11, and a second portion that is due to defects on the surface 11, for example the particle P shown in FIG. 2B.

The grating period G of a surface grating is related to the measurement wavelength $\lambda_M$ of the measurement radiation 9, the angle of incidence $\alpha_E$, of the measurement radiation 9 and the scattering angle as in accordance with the following equation (Bragg equation):

$$\sin(\alpha_E) - \sin(\alpha_S) = \lambda_M / G.$$

For normal incidence of the measurement radiation 9, that is to say for an angle of incidence $\alpha_E$ of the measurement radiation of 0° and a measurement wavelength $\lambda_M$ of 408 nm, at a first scattering angle $\alpha_1$ of approximately 32° and a second scattering angle $\alpha_2$ of approximately 68°, a maximum grating period $G_{MAX}$ of approximately 800 nm and a minimum grating period $G_{MIN}$ of 400 nm is obtained, that is to say the detection angle range specified above corresponds to a spatial wavelength range (or a range of grating periods G) between approximately 400 nm and approximately 800 nm. Said spatial wavelength range relates to the first portion of the scattered measurement radiation 9 brought about by scattered light due to the roughness of the surface 11.

For scattering centers or particles P having a diameter $D_S$ of less than approximately half the measurement wavelength $\lambda_M$, it is approximately true that the scattered light intensity I is proportional to the sixth power of the diameter, i.e. $I \sim D_S^6$ (Rayleigh scattering). Particles scatter in an approximately isotropic fashion, meaning that the intensity of the second portion of the scattered measurement radiation 9 recorded by the detector 12 is only marginally dependent on the selected detection angle range. With a suitable selection of the detection angle range, more precisely of the first scattering angle $\alpha_1$ and of the second scattering angle $\alpha_2$, which corresponds to a spatial wavelength range in which in an ideal manner the roughness of the surface 11 is minimum, the first portion of the scattered measurement radiation 9 that is captured by the detector 12 and is due to the roughness of the surface 11 can be minimized.

Relatively large scattering centers, as are caused by particles P, which typically lie in a diameter range between approximately $0.25\lambda_M$ and approximately $0.5\lambda_M$, result in a high scattered light intensity I in particular in objects such as conventional Si-wafers and masks that are used in the semiconductor field, while the roughness or unevennesses of the surfaces 11 result in a lower scattered light intensity I, as will be explained below with reference to FIG. 4.

Figure 4:
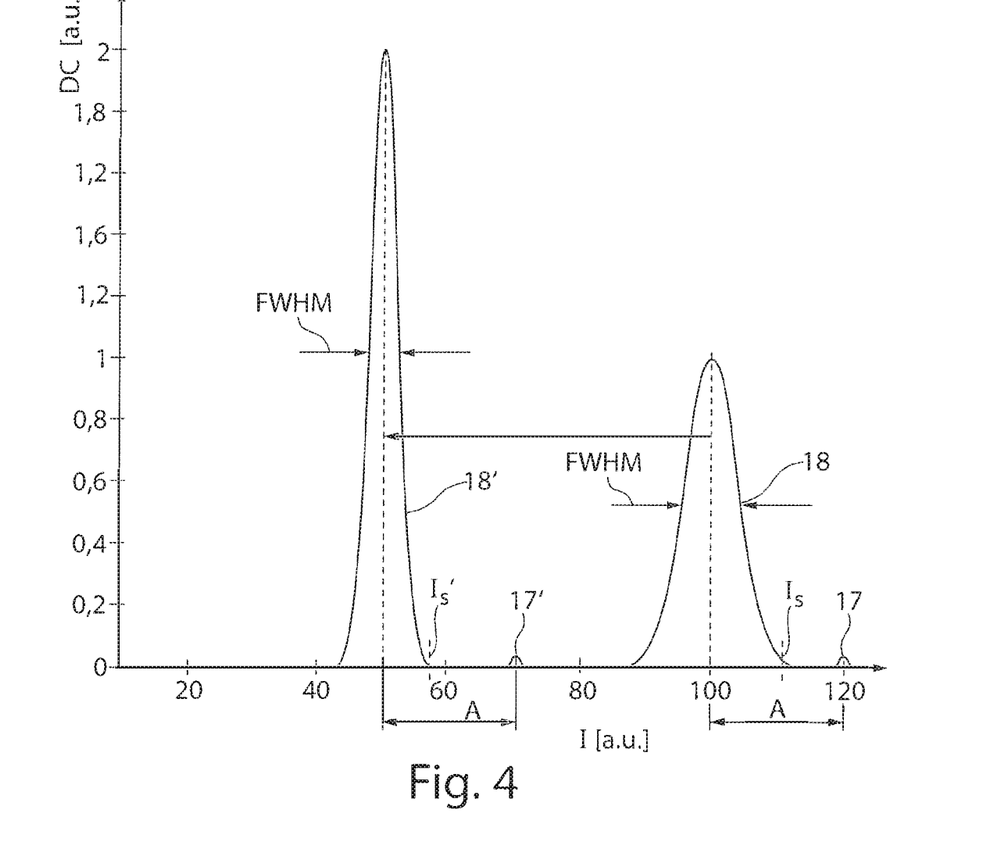
FIG. 4 shows a schematic illustration of the frequency distributions of the scattered light intensity recorded during the inspection of a conventional surface or during the inspection of a surface as per FIGS. 3A-C.

FIG. 4 shows what is known as the "defect count" (D.C.) of the scattered light intensity I, which has a first portion, referred to as the defect signal 17, and a second portion, referred to as the haze signal 18. The haze signal 18 represents a frequency distribution of the measurement radiation 9 that is scattered at the entire surface 11, that is to say of the entire measurement radiation 9 that is detected during the movement of the partial region T over the entire surface 11, which can be divided for example into a measurement grid during the measurement. The defect signal 17, by contrast, is the scattered light intensity I that was measured in a partial region T (for example corresponding to a grid element of the measurement grid). As can be seen in FIG. 4, the defect signal 17 has its maximum at a greater scattered light intensity I than the haze signal 18.

The defect signal 17 is due to particles P and possibly to further defects on the surface 11, whereas the haze signal 18 is substantially due to the roughness of the surface 11, because greater defects such as particles P lead to a higher scattered light intensity I (see above). If a scattered light intensity I that lies above an intensity threshold value $I_S$ is measured in a partial region T of the surface 11, it is assumed that a particle P is present on the surface 11 in the partial region T, that is to say in the case of a scattered light intensity I that is measured by the detector 12 and lies above the intensity threshold value $I_S$, then, with a specified irradiation duration, a particle P is detected.

An addition or integration is performed over the scattered measurement radiation 9 recorded in the partial region T during the irradiation duration before an adjacent partial region T of the measurement grid into which the surface 11 is divided for the measurement is examined for particles P in the same way. If a scattered light intensity I that lies above the threshold value $I_S$ is measured in a plurality of adjacent partial regions T, it is possible using suitable algorithms to deduce the presence of a scratch or of a local surface defect on the surface 11. The threshold value $I_S$ of the scattered light intensity I in a partial region T of the surface 11 being exceeded is therefore a necessary, but possibly not a sufficient criterion for the presence of a particle P in the partial region T of the surface 11.

As can be seen in FIG. 4, the haze signal 18 has a comparatively large full width at half maximum (FWHM), such that the right edge of the substantially Gaussian haze signal 18 possibly overlaps in part with the defect signal 17. Although the right edge of the haze signal 18 makes up only a comparatively small portion of the frequency distribution, it may still be the case that the scattered light intensity I lies above the intensity threshold value $I_S$ only because of the haze signal 18, which means that a particle P is detected in the partial region although no particle P is present on the surface 11 there. The intensity threshold value $I_S$ and thus the minimally detectable particle diameter $D_S$ can thus not be made arbitrarily small to avoid errors in the detection of particles P.

In order to reduce the detection limit, that is to say the minimally detectable particle diameter $D_S$, it is necessary to separate the haze signal 18 and the defect signal 17 from one another as much as possible. This can be accomplished by reducing the width of the haze signal 18, such that the intensity threshold value $I_S$ for the particle detection limit is also reduced. Although this could also be accomplished by reducing the roughness of the surface 11, this is generally not so easily possible.

Figure 3A:
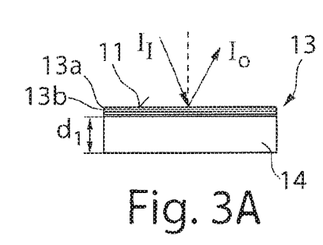
FIGS. 3A-3C show schematic illustrations of an object to be inspected, in which an anti-reflective coating is applied on the surface to be inspected (FIGS. 3A,3B) or in which the object has a surface structure for reducing the reflectivity of the surface to be inspected (FIG. 3C)

For reducing the detection limit, instead of using a conventional mask blank 2, a plate-shaped object 14 is introduced into the measurement apparatus 1 of FIG. 1A, on the surface of which an anti-reflective coating 13 is applied, as is shown in FIG. 3A. As can be seen in FIG. 2B, the upper side of a coating 13 applied with a homogeneous thickness follows the rough surface 11, that is to say the applied coating 13 does not increase the roughness of the surface 11. The surface 11 that is inspected using the measurement apparatus 1 of FIG. 1A thus substantially matches the original surface 11 in terms of its roughness.

On account of the anti-reflective coating 13, the reflectivity and thus the scattering effect of the surface 11 for the measurement radiation 9 is reduced, that is to say a lower first portion of the intensity $I_O$ of the intensity Ii of the measurement radiation 9 that is incident at a specific angle of incidence is reflected than in the case of a surface 11 on which no anti-reflective coating 13 is applied. On account of the reduced reflectivity, the first portion of the measurement radiation 9 that is incident on the detector 12 and is due to the surface roughness of the surface 11 is thus reduced, as a result of which the scattered light distribution measured on the surface 11 changes, as can be seen in FIG. 4:

The haze scattered light distribution 18' measured on the surface 11 that is provided with the anti-reflective coating 13 is reduced in terms of its scattered light intensity I, that is to say it is displaced to the left in FIG. 4. The defect peak or the defect signal 17' is likewise displaced to the left, but the distance A between the maximum of the haze scattered light distribution 18' and the maximum of the defect signal 17' remains constant. This is based on the assumption that the entire scattered light intensity I emanating from a grid element of the surface 11 is additively composed of the scattered light portion of the surface 11, that is to say the haze signal 18 or 18', and the defect signal 17 or 17'.

In the example shown in FIG. 4, it was assumed that the reflectivity of the surface 11 is halved by the anti-reflective coating 13. Therefore, the scattered light intensity at which the haze signal 18, 18' has the maximum reduces from 100 a.u. to 50 a.u., as is clearly evident from FIG. 4. The standard deviation or the FWHM value of the haze signal 18, 18' also changes accordingly: In the case of the surface 11 without anti-reflective coating, the FWHM value is approximately 10 a.u. (between approximately 95 a.u. and approximately 105 a.u.). In the case of a reduction of the reflectivity of the surface 11 to a half, the FWHM value is also reduced to a half, that is to say to approximately 5 a.u. (105/2 a.u.-95/2 a.u.). The intensity threshold value $I_S$ or $I_{S'}$, which is typically defined on the basis of a scattering measure of the haze signal 18, 18' (see below), is reduced accordingly. Therefore, the intensity threshold value $I_{S'}$ in the case of the haze signal 18' that is displaced to the left can likewise be displaced to the left in a direction to the maximum of the displaced haze signal 18', without the error rate in the detection of particles P increasing here.

The intensity threshold value $I_s$ or $I_{s'}$ can be fixed for example in dependence on the variance, the FWHM value, the standard deviation or another measure of dispersion of the haze signal 18, 18'. For example, the intensity threshold value $I_s$ or $I_{s'}$ can be defined as what is known as a 3 σ value, that is to say a scattered light intensity $I_s$ or $I_{s'}$ that is more than three times the standard deviation σ of the haze signal 18, 18'—measured starting from the maximum of the haze signal 18, 18'—is considered to be associated with the defect signal 17 and is evaluated to mean the presence of a particle P. The measures of dispersion of the haze signal 18, 18' can also be converted into one another, for example for the standard deviation σ, from which the intensity threshold value $I_s$ or $I_{s'}$ is determined, and the FWHM value illustrated in FIG. 4, the following relationship applies: FWHM value≈2.3548 σ.

Figure 5:
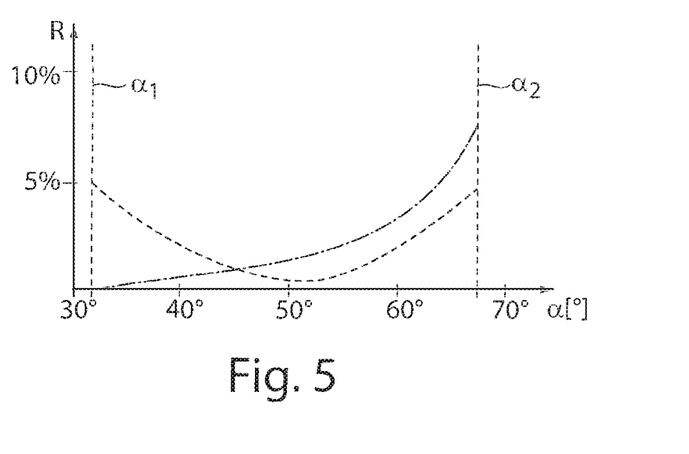
FIG. 5 shows a schematic illustration of the reflectivities of the surface of FIG. 3A provided with two different anti-reflective coatings within a detection angle range of the measurement apparatus.

The anti-reflective coating 13 applied on the plate-type object 14 is in the example shown in FIG. 3A a multilayer coating having a plurality of individual layers 13A, 13B with a high and low refractive index in alternation for the measurement wavelength $\lambda_M$, the layer thicknesses of which are selected such that destructive interference occurs for measurement radiation 9 at the measurement wavelength $\lambda_M$ of 405 nm. The reflectivity R of the object 14 in the detection angle range between the first scattering angle cu and the second scattering angle $\alpha_2$ can here be lowered to less than 5.0%, as is shown in FIG. 5 for two anti-reflective coatings. The reflectivities R illustrated by a dash-dotted line or a dashed line correspond to two differently constructed anti-reflective coatings 13, which are applied in each case onto an object 14 made of silicon in the form of a silicon wafer. The exact layer construction of the anti-reflective coatings 13 will not be discussed in more detail here. One of the two anti-reflective coatings 13 is optimized for this detection angle range, with the result that the difference between a maximum value $R_{MAX}$ of the reflectivity R and a minimum value $R_{MIN}$ of the reflectivity R in the detection angle range lies at less than approximately 5%, that is to say for the reflectivity R in the detection angle range: $R_{MAX}$-$R_{MIN}$<5.0%.

Unlike in the case that is illustrated in FIG. 5 by the dashed-dotted line for the reflectivity R of the anti-reflective coating 13, the minimum reflectivity $R_{MIN}$ is not necessarily achieved at the first scattering angle cu and the maximum reflectivity $R_{MAX}$ is not necessarily achieved at the second scattering angle $\alpha_2$. Ideally, the reflectivity R of the anti-reflective coating 13 is (approximately) constant over the entire detection angle range, as is the case for the reflectivity R of the anti-reflective coating 13 that is illustrated in FIG. 5 by way of the dashed line. It is to be understood that a corresponding anti-reflective coating 13 can also be optimized for measurement radiation 12 in the UV wavelength range, for example at a measurement wavelength $\lambda_M$ of for example approximately 248 nm. For the optimization of the anti-reflective coating 13, it is necessary to know the refractive index of the object 14.

As an alternative to the above-described example, in which the plate-type object 14 is a silicon wafer, the plate-type object 14 can for example also be an optical filter glass, in particular a long-pass filter glass that is sold commercially by Schott under the trade name RG1000 and has a refractive index of approximately 1.54 for measurement radiation 9 at the measurement wavelength $\lambda_M$ of 405 nm. The object 14 in the form of the long-pass filter glass has, at a thickness $d_1$ of 3 mm, a residual transmittance of less than $10^{-5}$, that is to say practically no measurement radiation 9 is reflected from the rear side of the object 14. On account of the anti-reflective coating 13 at the front side of the object 14, the reflectivity R of the surface 11 can be reduced by more than a factor 18 as compared to an uncoated surface 11.

The thickness $d_1$ of the object 14 and the dimensions thereof are selected such that it fits in the measurement apparatus 1 of FIG. 1A such that the object 14 can be measured therein. Instead of a wafer or an optical filter glass, the object 14 used can also be different materials, for example as are customary for mask blanks 2, for example quartz glass, titanium-doped quartz glass or a glass ceramic (in the case of mask blanks for EUV lithography). In particular, a conventional mask blank 2 can be prepared for the measurement by way of an anti-reflective coating 13 being applied thereon or by way of it possibly being microstructured, as will be described in more detail below.

Figure 3B:
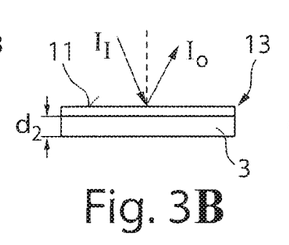

As was described further above, it is also possible to prepare a wafer 3 for the measurement in the measurement apparatus 1 of FIG. 1A to lower the signal-to-noise ratio or to lower the particle detection limit. FIG. 3B shows such a silicon wafer 3 on which an anti-reflective coating 13 is applied that can be constructed for example as in the thesis "Entspiegelung von Silizium-Photodioden nach dem Vorbild der Nanooptik von Mottenaugen", D. Gabler, T U Ilmenau, 2005, cited in the introductory part, and that can consist for example of silicon nitride $Si_xN_y$.

On account of such an anti-reflective coating 13, the reflectivity R for the measurement radiation 9 at the measurement wavelength $\lambda_M$ of 405 nm can be lowered approximately by a factor 4 with respect to a surface 11 made from uncoated silicon. The reflectivity R of uncoated silicon in the visible wavelength range is typically more than approximately 30%, at a measurement wavelength $\lambda_M$ of 405 nm is approximately 50%, and the reflectivity R of the surface 11 that is provided with the anti-reflective coating 13 of FIG. 3B is less than approximately 5% (cf. FIG. 5). The absorption coefficient of crystalline silicon at the measurement wavelength $\lambda_M$ is more than $10^5$ 1/cm. A commercially available wafer 3 has a thickness $d_2$ of approximately 650 µm, such that practically no measurement radiation 9 arrives at the rear side of the wafer 3 anymore and is reflected thereby.

It is to be understood that, on account of an optimization of the anti-reflective coating 13 for example by surface structuring or by the selection of a different measurement wavelength $\lambda_M$, the reflectivity R of the wafer 3 or of the surface 11 for the measurement radiation 9 is further reduced and thus the detection limit for particles P in the scattered light measurement can be lowered further.

Figure 3C:
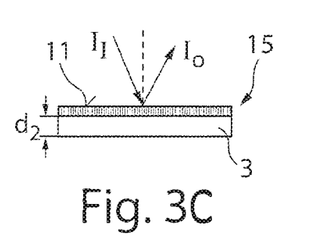

FIG. 3C shows a wafer 3, in the case of which a surface structure 15 is applied for reducing the reflectivity R of the surface 11, said surface structure 15 in the example illustrated being what is known as black silicon, that is to say a needle-type microstructure that was produced by high-energy bombardment with ions or with ultrashort laser pulses. The surface structure 15 in the form of the black silicon increases the absorption of the measurement radiation 9 at the surface 11 and thus significantly reduces the reflectivity R thereof for measurement radiation 9 at the measurement wavelength $\lambda_M$ of 405 nm, specifically to less than approximately 2%, that is to say by a factor of approximately 20. In the case of the wafer 3 shown in FIG. 3C, the particle detection limit can therefore be significantly lowered as compared to a conventional, non-surface-structured wafer 3.

Instead of a conventional wafer 3, the anti-reflective coating 13 or the surface structure 15 may also be provided on a wafer 3 that differs from a conventional wafer in that an epitaxially vapor-deposited silicon layer was applied onto the surface 11 to reduce the number of defects. Roughness measurements have shown that in the case of a wafer 3 having such an epitaxial silicon layer, the surface roughness is increased with respect to a conventional silicon wafer, as a result of which the particle detection limit increases (see above). By reducing the reflection of the surface 11 of such a modified silicon wafer 3, the particle detection limit can be lowered to an acceptable value. Even in other types of layers that are applied on a wafer 3 serving as a substrate or on a mask blank 2, the particle detection limit can be lowered in the above-described manner.

It is to be understood that a combination of a surface structure 15 and an anti-reflective coating 13 that is applied onto the structured surface 11 can also be used to reduce the reflectivity R of the surface 11. To reduce the reflectivity R of the surface 11, it is also possible to use for example a grating structure or a moth-eye structure instead of a needle-type microstructure.

In principle, the reflectivity R of the surface 11 can also be reduced by a gradual or possibly continuous transition of the refractive index taking place from the environment of the object 2, 3, 14, typically air, to the material of the object 2, 3, 14, that is to say a modification of the surface 11 that produces (as an effective medium) such a refractive index profile or such a transition generally leads to a reduction in the reflectivity of the surface 11. Corresponding effective media can therefore be used to reduce the reflectivity R of the surface 11 for the detection of particles P that is described further above.

In summary, it is possible in the manner described further above, that is to say by using a test object 2, 3, 14 having a suitably modified surface 11 that is reduced in terms of its reflectivity R, to lower the particle detection limit such that particles P having a smaller particle diameter $D_S$ can be detected without hereby increasing the error rate.

What is claimed is:

1. A method for detecting deposited particles on a surface of an object, comprising:
   irradiating a partial region of the surface of the object with measurement radiation;
   detecting scattered measurement radiation scattered at the irradiated partial region;
   detecting the particles on the surface of the object based on the detected scattered measurement radiation; and
   during said irradiating and said detecting of the scattered measurement radiation, providing the surface of the object with at least one of an anti-reflective coating and a surface structure that reduces a reflectivity of the surface for the measurement radiation,
   wherein the anti-reflective coating and/or the surface structure lowers a particle detection limit for the particles on the surface of the object by decreasing a full width at half maximum (FWHM) value of a haze signal for scattered light distribution due to roughness of the surface, and
   wherein the particle detection limit is based on an intensity threshold value that is dependent on a measure of dispersion of the haze signal.

2. The method as claimed in claim 1, wherein the object is a wafer for microlithography or a mask blank for microlithography, and wherein the particles are detected on the surface of the object.

3. The method as claimed in claim 1, wherein the measurement radiation has a predetermined measurement wavelength ($\lambda_M$).

4. The method as claimed in claim 1, wherein the scattered measurement radiation is detected in a detection angle range between a first scattering angle ($\alpha_1$) and a second scattering angle ($\alpha_2$) with respect to the measurement radiation incident on the surface of the object.

5. The method as claimed in claim 4, wherein the anti-reflective coating has, in the detection angle range between the first scattering angle ($\alpha_1$) and the second scattering angle ($\alpha_2$), an angle-dependent reflectivity (R) for the measurement radiation at which a difference between a maximum value ($R_{MAX}$) of the reflectivity and a minimum value ($R_{MIN}$) of the reflectivity is less than 5%.

6. The method as claimed in claim 5, wherein the difference between the maximum value ($R_{MAX}$) of the reflectivity and the minimum value ($R_{MIN}$) of the reflectivity is less than 1%.

7. The method as claimed in claim 1, wherein the anti-reflective coating is formed as a multilayer coating.

8. The method as claimed in claim 1, wherein the reflectivity (R) of the anti-reflective coating for the measurement radiation is less than 15%.

9. The method as claimed in claim 8, wherein the reflectivity (R) of the anti-reflective coating for the measurement radiation is less than 1%.

10. The method as claimed in claim 1, wherein the surface structure is formed as a needle-type microstructure.

11. The method as claimed in claim 1, in which the object is made from silicon.

12. The method as claimed in claim 11, wherein the surface structure is formed as black silicon.

13. The method as claimed in claim 1, wherein the object is formed from an optical filter glass for filtering the measurement radiation.

14. The method as claimed in claim 1, wherein the object is made from a material that has, for the measurement radiation, an absorption coefficient of more than $1\times10^4$ 1/cm.

15. The method as claimed in claim 1, wherein the object has a thickness ($d_1$, $d_2$) of at least 500 μm.

16. The method as claimed in claim 1, wherein one of the particles is detected in the irradiated partial region when a scattered light intensity (I) of the scattered measurement radiation that is scattered at the partial region lies above an intensity threshold value ($I_S$).

17. The method as claimed in claim 1, wherein at least said irradiating of the object with the measurement radiation and said detecting of the scattered measurement radiation are performed on a measurement apparatus for measuring at least one of microlithographic mask blanks and microlithographic wafers.

* * * * *

UNITED STATES PATENT AND TRADEMARK OFFICE
CERTIFICATE OF CORRECTION

PATENT NO. : 11,555,783 B2
APPLICATION NO. : 16/585374
DATED : January 17, 2023
INVENTOR(S) : Beyer et al.

It is certified that error appears in the above-identified patent and that said Letters Patent is hereby corrected as shown below:

On the Title Page

Page 2, Column 2, item [56] at Line 12, delete "Photodoiden" and insert -- Photodioden --.

Page 2, Column 2, item [56] at Line 13, delete "vased" and insert -- based --.

Page 2, Column 2, item [56] at Line 15, delete "Illmenau." and insert -- Ilmenau. --.

In the Specification

Column 1, Line 31, delete "clean room" and insert -- cleanroom --.

Column 7, Lines 9-10, delete "unevennesses" and insert -- unevenness --.

Column 10, Line 4, delete "as" and insert -- $\alpha_S$ --.

Column 10, Line 39, delete "0.25$\lambda_M$" and insert -- 0.25 $\lambda_M$ --.

Column 10, Line 39, delete "0. 5$\lambda_M$," and insert -- 0.5 $\lambda_M$, --.

Column 10, Line 42, delete "unevennesses" and insert -- unevenness --.

Column 11, Line 64, delete "FIG. 4:" and insert -- FIG. 4. --.

Column 12, Line 23, delete "$I_{S'}$," and insert -- $I_S$', --.

Column 12, Line 26, delete "$I_{S'}$" and insert -- $I_S$' --.

Column 12, Line 31, delete "$I_{S'}$" and insert -- $I_S$' --.

Signed and Sealed this
Fifth Day of December, 2023

*Katherine Kelly Vidal*
Katherine Kelly Vidal
*Director of the United States Patent and Trademark Office*

Column 12, Line 35, delete "$I_{S'}$" and insert -- $I_S'$ --.

Column 12, Line 36, delete "$I_{S'}$" and insert -- $I_S'$ --.

Column 12, Line 44, delete "$I_S$ or $I_{S'}$" and insert -- $I_S$ or $I_S'$ --.